(12) United States Patent
Burak et al.

(10) Patent No.: US 9,548,438 B2
(45) Date of Patent: Jan. 17, 2017

(54) ACOUSTIC RESONATOR COMPRISING ACOUSTIC REDISTRIBUTION LAYERS

(71) Applicant: Avago Technologies General IP (Singapore) Pte. Ltd., Singapore (SG)

(72) Inventors: Dariusz Burak, Fort Collins, CO (US); Stefan Bader, Fort Collins, CO (US); Alexandre Shirakawa, San Jose, CA (US); Kevin J. Grannen, Thornton, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 310 days.

(21) Appl. No.: 14/231,325

(22) Filed: Mar. 31, 2014

(65) Prior Publication Data

US 2015/0280100 A1   Oct. 1, 2015

(51) Int. Cl.
*H03H 9/02* (2006.01)
*H01L 41/047* (2006.01)
*H03H 9/17* (2006.01)
*H03H 9/13* (2006.01)
*H03H 9/58* (2006.01)

(52) U.S. Cl.
CPC ...... *H01L 41/0477* (2013.01); *H03H 9/02086* (2013.01); *H03H 9/132* (2013.01); *H03H 9/171* (2013.01); *H03H 9/584* (2013.01)

(58) Field of Classification Search
CPC . H01L 41/0477; H03H 9/02086; H03H 9/132; H03H 9/171; H03H 9/584
USPC ........................................ 310/321, 363, 364
See application file for complete search history.

(56) References Cited

U.S. PATENT DOCUMENTS

| | | |
|---|---|---|
| 5,587,620 A | 12/1996 | Ruby et al. |
| 5,873,153 A | 2/1999 | Ruby et al. |
| 6,107,721 A | 8/2000 | Lakin |
| 6,291,931 B1 | 9/2001 | Lakin |
| 6,384,697 B1 | 5/2002 | Ruby |
| 6,507,983 B1 | 1/2003 | Ruby et al. |
| 6,548,943 B2 | 4/2003 | Kaitila et al. |
| 7,275,292 B2 | 10/2007 | Ruby et al. |
| 7,280,007 B2 | 10/2007 | Feng et al. |
| 7,388,454 B2 | 6/2008 | Ruby et al. |

(Continued)

OTHER PUBLICATIONS

Co-pending U.S. Appl. No. 13/658,024, filed Oct. 23, 2012.

(Continued)

*Primary Examiner* — Derek Rosenau

(57) ABSTRACT

An acoustic resonator structure comprises a piezoelectric layer having a first surface and a second surface, a first electrode disposed adjacent to the first surface, and a second electrode disposed adjacent to the second surface. The first electrode comprises a first conductive layer disposed adjacent to the piezoelectric layer and having a first acoustic impedance, and a second conductive layer disposed on a side of the first conductive layer opposite the piezoelectric layer and having a second acoustic impedance greater than the first acoustic impedance. The second electrode may be disposed between a substrate and the piezoelectric layer, and it may comprise a third conductive layer disposed adjacent to the piezoelectric layer and having a third acoustic impedance, and a fourth conductive layer disposed on a side of the third conductive layer opposite the piezoelectric layer and having a fourth acoustic impedance greater than the third acoustic impedance.

35 Claims, 14 Drawing Sheets

(56) References Cited

U.S. PATENT DOCUMENTS

| | | | |
|---|---|---|---|
| 7,612,488 B1* | 11/2009 | Bouche | H03H 9/589 310/320 |
| 7,629,865 B2 | 12/2009 | Ruby | |
| 8,330,325 B1 | 12/2012 | Burak et al. | |
| 8,601,333 B2 | 12/2013 | Fang et al. | |
| 2006/0255693 A1* | 11/2006 | Nishihara | H03H 9/131 310/365 |
| 2007/0205850 A1 | 9/2007 | Jamneala et al. | |
| 2008/0258842 A1 | 10/2008 | Ruby et al. | |
| 2010/0327994 A1 | 12/2010 | Choy et al. | |
| 2012/0293278 A1 | 11/2012 | Burak et al. | |
| 2013/0176086 A1 | 7/2013 | Bradley et al. | |
| 2013/0335169 A1 | 12/2013 | Godshalk et al. | |
| 2014/0118090 A1 | 5/2014 | Grannen et al. | |
| 2014/0125202 A1 | 5/2014 | Choy et al. | |
| 2014/0125203 A1 | 5/2014 | Choy et al. | |
| 2014/0132117 A1 | 5/2014 | Larson, III | |
| 2014/0152152 A1 | 6/2014 | Burak et al. | |
| 2014/0159548 A1 | 6/2014 | Burak et al. | |
| 2014/0174908 A1* | 6/2014 | Feng | H03H 3/02 204/192.1 |
| 2014/0175950 A1 | 6/2014 | Zou et al. | |
| 2014/0176261 A1 | 6/2014 | Burak et al. | |
| 2014/0225682 A1 | 8/2014 | Burak et al. | |
| 2014/0225683 A1 | 8/2014 | Burak et al. | |
| 2014/0232244 A1 | 8/2014 | Sridaran | |
| 2014/0232486 A1 | 8/2014 | Burak | |
| 2014/0246305 A1 | 9/2014 | Larson, III | |

OTHER PUBLICATIONS

Co-pending U.S. Appl. No. 13/663,449, filed Oct. 29, 2012.
Co-pending U.S. Appl. No. 13/660,941, filed Oct. 25, 2012.
Co-pending U.S. Appl. No. 13/654,718, filed Oct. 18, 2012.
Fang, et al. "Development of 2.4-GHz film bulk acoustic wave filter for wireless communication", J. Micro/Nanolith. MEMS MOEMS 8 (2), Apr.-Jun. 2009.
Chen, "Fabrication and Characterization of AIn Thin Film Bulk Acoustic Wave Resonator", Dissertation, University of Pittsburgh School of Engineering, 2006.
Martin, et al., "Re-growth of C-Axis Oriented AIN Thin Films", IEEE Ultrasonics Symposium, 2006, 169-172.
Martin, et al., "Shear Mode Coupling and Tilted Gram Growth of AIN Thin Films in BAW Resonators", IEEE Transactions on Ultrasonics, Ferroelectrics, and Frequency Control, vol. 53, No. 7, Jul. 2006, 1339-1343.
Ranjan et al. "Strained Hexagonal ScN: A Material with Unusual Structural and Optical Properties," Physical Review Letters, 2003 Jun. 27, vol. 90, No. 25, The American Physical Society, USA.
Farrer et al., "Properties of hexagonal ScN versus wurtzite GaN and InN," Physical Review B, 2002 Nov. 20, vol. 66, No. 20, The American Physical Society, USA.
Constantin et al., "Composition-dependent structural properties in ScGaN alloy films: A combined experimental and theoretical study," Journal of Applied Physics, 2005 Dec. 16, vol. 98, No. 12, American Institute of Physics, USA.
Akiyama et al., "Enhancement of piezoelectric response in scandium aluminum nitride alloy thin films prepared by lual reactive cosputtering," Advanced Materials, 2009, vol. 21, pp. 593-596, Japan.
Suzuki et al., "Influence of shadowing effect on shear mode acoustic properties in the c-axis tilted AIN films," IEEE Ultrasonics Symposium (IUS), 2010, pp. 1478-1481.
Yanagitani et al., "Giant shear mode electromechanical coupling coefficient k12 in c-axis tilted ScAIN films," IEEE Ultrasonics Symposium (IUS), 2010.
NPL List of Rare Earth Elements, Rare Element Resources [Cited by the Examiner in Office Action mailed Jun. 23, 2016 in Co-Pending U.S. Appl. No. 14/161,564. No date provided on document or by the Examiner].

* cited by examiner

ACOUSTIC RESONATOR COMPRISING ACOUSTIC REDISTRIBUTION LAYERS

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs).

A typical acoustic resonator comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves (or modes) that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

In general, the performance of an acoustic resonator can be evaluated by the values of its parallel resistance Rp, series resistance Rs, quality (Q) factor, and its electromechanical coupling coefficient $kt^2$. The series resistance Rs is the smallest value of magnitude of input impedance of the acoustic resonator, and series resonance frequency Fs is a frequency at which that minimum occurs. The parallel resistance Rp is the largest value of magnitude of input impedance of the acoustic resonator, and parallel resonance frequency Fp is a frequency at which that maximum occurs. The Q-factor is a parameter that quantifies the amount of energy lost in one cycle of oscillations. The electromechanical coupling coefficient $kt^2$ is a normalized difference between parallel and series resonance frequencies Fp and Fs and is typically expressed in percent values (%).

Devices with higher Rp, higher Q-factor and lower Rs are considered to have superior performance compared to devices with lower Rp, lower Q-factor and higher Rs. Thus, other things being equal, it is desirable to provide a filter with an acoustic resonator having a higher Rp, higher Q-factor, and lower Rs. Nevertheless, these performance parameters are typically in a tradeoff relationship with other design factors, such as the cost and size of an acoustic resonator. For instance, in some designs, reducing the size of an acoustic resonator to achieve reduced cost may degrade one or more of the performance parameters. Accordingly, there is a general need for improved resonator designs that achieve improvements such as cost and size scaling without unduly compromising performance.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
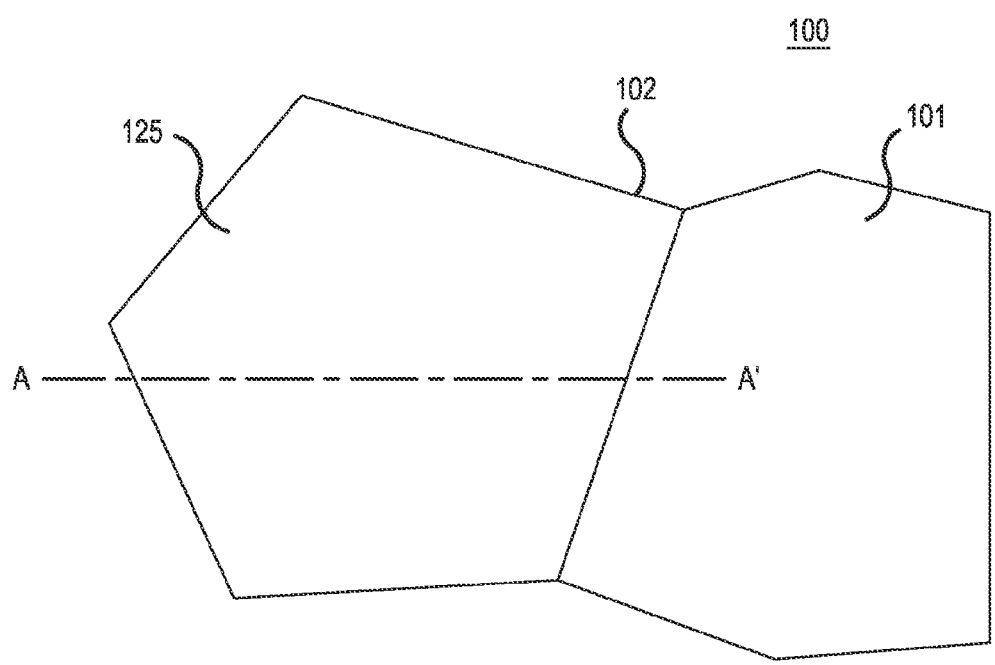
FIG. 1A is a top view of an acoustic resonator according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms 'a', 'an' and 'the' include both singular and plural referents, unless the context clearly dictates otherwise. Thus, for example, 'a device' includes one device and plural devices. The terms 'substantial' or 'substantially' mean to within acceptable limits or degree. The term 'approximately' means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The described embodiments relate generally to acoustic resonators such as film bulk acoustic wave resonators (FBARs) or solidly mounted resonators (SMRs), although much of the discussion is directed to FBARs for the sake of convenience. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkei et al.; U.S. patent application Ser. No. 13/663,449 to Burak et al; U.S. patent application Ser. No. 13/660,941 to Burak et al.; U.S. patent application Ser. No. 13/654,718 to Burak et al; U.S. Patent App. Pub. No. 2008/0258842 to Ruby et at; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

The described embodiments relate generally to acoustic resonators comprising Acoustic Redistribution Layers (ARLs). For example, in certain embodiments, an FBAR comprises a piezoelectric layer disposed between first and second electrodes, wherein at least one of the first and second electrodes comprises multiple layers with respective acoustic impedances that increase with distance from the piezoelectric layer. The use of such acoustic redistribution layers can increase the so called Fractional Frequency Separation (FFS) of the acoustic resonator, which is correlated with Rp and Q-factor. Accordingly, it can be used to create acoustic resonators with increased Rp and Q-factor.

The use of acoustic redistribution layers to increase Rp and Q-factor may allow some acoustic resonators to be manufactured with reduced size, and therefore reduced cost. In general, acoustic resonator is designed to meet a specific characteristic electrical impedance $Z_0$ requirement. The characteristic electrical impedance $Z_0$ is proportional to the resonator area and inversely proportional to the desired frequency of operation and thickness of the piezoelectric layer. The thickness of the piezoelectric layer is predominantly determined by the desired frequency of operation but also by the desired electromechanical coupling coefficient $kt^2$. Within applicable limits, $kt^2$ is proportional to thickness of the piezoelectric layer and inversely proportional to thicknesses of bottom and top electrodes. More specifically, $kt^2$ is proportional to the fraction of acoustic energy stored in the piezoelectric layer and inversely proportional to the fraction of acoustic energy stored in the electrodes. Thus, for a predetermined $Z_0$ the resonator size, and therefore its cost, may be reduced by using piezoelectric material with higher effective $kt^2$, as it allows to use thinner piezoelectric layer (and therefore reduce its area) at the expense of increasing thicknesses of the electrodes in order to maintain the desired resonance frequency. Thus, an acoustic resonator using a high effective $kt^2$ piezoelectric material (e.g., aluminum scandium nitride (ASN) having 9 at % scandium instead of standard aluminum nitride (AlN)) can be designed to be relatively thin while maintaining desired $kt^2$ of the resonator. Such designs, however, enforce large confinement of acoustic energy into electrodes (typically more than 20%, or so called metal-heavy stacks), which is very unfavorable for FFS (to be discussed in detail below), and therefore for Rp and Q-factor. The use of Acoustic Redistribution Layers allows an increase in FFS for metal-heavy stacks, while preserving series resonance (Fs) and $kt^2$ and only minimally increasing area of the resonator.

Figure 1B:
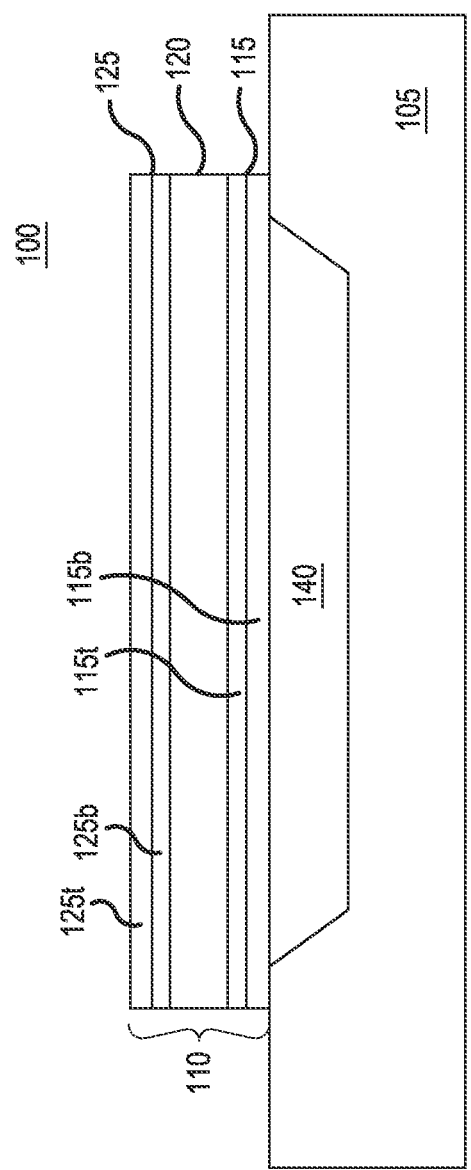
FIG. 1B is a cross-sectional view of the acoustic resonator of FIG. 1A in accordance with a representative embodiment.
Figure 1C:
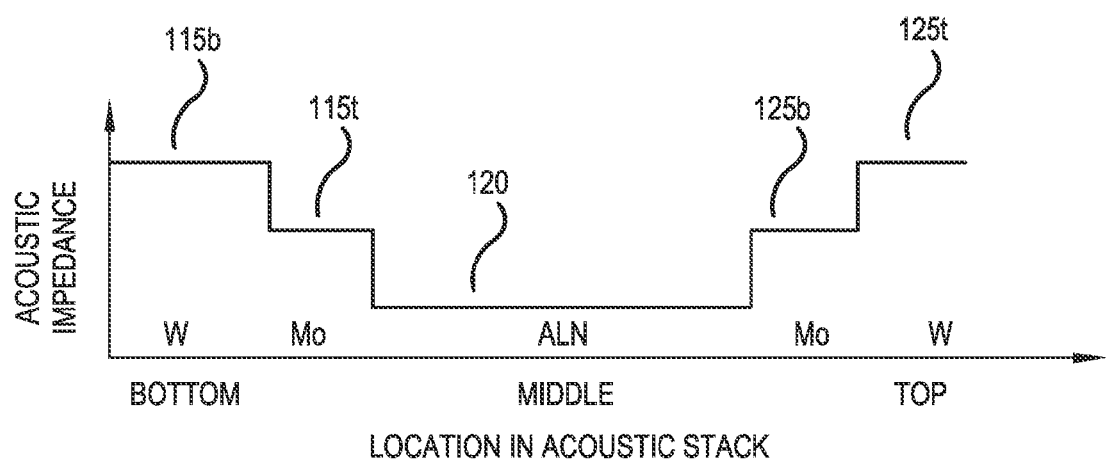
FIG. 1C is a graph illustrating an acoustic impedance profile of an acoustic stack of the acoustic resonator of FIG. 1A.

FIG. 1A is a top view of an acoustic resonator 100 according to a representative embodiment, FIG. 1B is a cross-sectional view of acoustic resonator 100 in accordance with a representative embodiment, and FIG. 1C is a graph illustrating an acoustic impedance profile of an acoustic stack of acoustic resonator 100. In the illustrated embodiments, acoustic resonator 100 comprises an FBAR, although it could take another form, such as a double bulk acoustic resonator (DBAR) or solidly mounted resonator (SMR), for example.

Referring to FIG. 1A, acoustic resonator 100 comprises an acoustic stack having an apodized pentagonal structure, i.e. an asymmetric pentagon, to distribute spurious mode density over frequency and avoid strong excitation of any of spurious modes at any one frequency. In general, acoustic resonator shape is not limited five sides. For example, common alternative designs include quadrilaterals, pentagons, and other shapes.

Acoustic resonator 100 comprises a top electrode 125 (referred to as a second electrode below), a connection side 101, and an interconnect 102. Connection side 101 is configured to provide an electrical connection to interconnect 102. Interconnect 102 provides electrical signals to top electrode 125 to excite desired acoustic waves in a piezoelectric layer (not shown in FIG. 1A) of acoustic resonator 100.

Referring to FIG. 1B, acoustic resonator 100 comprises a substrate 105 and an acoustic stack 110 in a simplified representation.

Substrate 105 can be formed of various types of semiconductor materials compatible with semiconductor processes, such as silicon (Si), gallium arsenide (GaAs), indium phosphide (InP), or the like, which can be useful for integrating connections and electronics, dissipating heat generated from a resonator, thus reducing size and cost and enhancing performance. Substrate 105 has an air cavity 140 located below acoustic stack 110 to allow free movement of acoustic stack 110 during operation. Air cavity 140 is typically formed by etching substrate 105 and depositing a sacrificial layer therein prior to formation of acoustic stack 110, and then removing the sacrificial layer subsequent to the formation of acoustic stack 110. As an alternative to air cavity 140, acoustic resonator 100 could include an acoustic reflector such as a Distributed Bragg Reflector (DBR), for example.

Acoustic stack 110 comprises a first electrode 115, a piezoelectric layer 120 formed on first electrode 115, and second electrode 125 formed on piezoelectric layer 120. First electrode 115 comprises a bottom conductive layer 115b and a top conductive layer 115t. Second electrode 125 comprises a bottom conductive layer 125b and a top conductive layer 125t. The conductive layers of first and second electrodes 115 and 125 are formed of materials that have acoustic impedances that increase with their distance from piezoelectric layer 120. For example, bottom conductive layer 115b and top conductive layer 125t may be formed of a material having relatively high acoustic impedance, such as (W) or iridium (Ir), while top conductive layer 115t and bottom conductive layer 125b may be formed of a material having relatively high acoustic impedance, such as molybdenum (Mo) or niobium (Nb). Various alternative materials that can be used in first and second electrodes 115 and 125 (in addition to or instead of those listed above) include, e.g., aluminum (Al), platinum (Pt), ruthenium (Ru), or hafnium (Hf).

Second electrode 125 may further comprise a passivation layer (not shown), which can be formed of various types of materials, including AlN, silicon carbide (SiC), non-etchable boron-doped silicon glass (NEBSG), silicon dioxide ($SiO_2$), silicon nitride (SiN), polysilicon, and the like. The thickness of the passivation layer should generally be sufficient to protect the layers of acoustic stack 110 from chemical reactions with substances that may enter through a leak in a package.

First and second electrodes 115 and 125 are electrically connected to external circuitry via corresponding contact pads, which are typically formed of a conductive material, such as gold or gold-tin alloy. Although not shown in FIG. 1B, connections between electrodes and the contact pads extend laterally outward from acoustic stack 110. The connections are generally formed of a suitable conductive material, such as Ti/W/gold.

Piezoelectric layer 120 is typically formed of a thin film piezoelectric comprising $Al_{1-x}Sc_xN$, although it may be formed of other piezoelectric materials, such as AlN or zinc oxide (ZnO). In some embodiments, piezoelectric layer 120 is formed on a seed layer (not shown) disposed over an upper surface of first electrode 115. The seed layer can be formed of AlN, for instance, to foster growth of $Al_{1-x}Sc_xN$.

Referring to FIG. 1C, the acoustic impedance of various layer of acoustic stack 110 is shown as a function of vertical location in the stuck. The vertical location (i.e., as viewed in FIG. 1B) is represented along the horizontal-axis in FIG. 1C. In the example of FIG. 1C, the example acoustic stack 110 comprises sequentially stacked layers of W, Mo, AlN, Mo, and W. The acoustic impedance increases monotonically with distance from piezoelectric layer 120, which tends to distribute acoustic energy across the acoustic stack. In various alternative embodiments, other materials could be used to achieve a similar acoustic impedance profile in which acoustic impedance increases according to distance from piezoelectric layer 120. For instance, the following materials could be used in various combinations to achieve a similar acoustic impedance profile: iridium, which has an acoustic impedance of about 110 MR (mega-Rayls); tungsten, which has an acoustic impedance of about 100 MR; molybdenum, which has an acoustic impedance of about 65 MR; niobium, which has an acoustic impedance of about 42 MR; and niobium molybdenum alloys, which have an acoustic impedance of about 42-65 MR depending on a specific composition.

An acoustic redistribution layer (ARL) is a layer of material added to the acoustic stack to change the acoustic energy distribution across the stack. In general, basic electromechanical characteristics of acoustic stacks, such as cutoff-frequencies of various resonances supported by the acoustic stack or electromechanical coupling coefficient $kt_2$ (in a case when piezoelectric material is present in the stack) are determined by weighted parameters (for instance, sound velocity, Poisson ratio and material density) of each single layer, with the weighting factor determined by a fraction of acoustic energy confined in that specific layer. Thus changing the acoustic energy distribution throughout the stack changes the electromechanical characteristics of that stack. For purely longitudinal motion (such as when the motion is driven by providing a vertical electrical bias for piezoelectric layer), acoustic energy distribution is determined by acoustic impedance of each layer, with low acoustic impedance layers tending to confine more energy. For more general types of motion that include horizontal (or shear) components the acoustic energy distribution across the stack is determined both by acoustic impedance and Poisson ratio of each layer.

For instance, typical acoustic stack of acoustic resonator 100 shown in FIG. 1A would have only a single metal, such as only W or only Mo, used for first and second electrodes 115 and 125. The metal material selection criteria would be based on specific performance and processing requirements of acoustic resonator 100. For example, because acoustic impedance of W is larger than that of Mo, W would be used to increase $kt_2$ as it may allow confinement of more acoustic energy in the piezoelectric layer 120. As will be discussed in relation to FIG. 4, for some acoustic stacks, for instance designed to meet low $kt_2$ requirements or to minimize the resonator area, a significant fraction of acoustic energy may be confined first and second electrodes 115 and 125, respectively, comprising W. Such specific energy distribution, while beneficial for minimizing the resonator size, may lead to increased degradation of other important performance characteristics of acoustic resonator 100, such as Rp and Q. Insertion of Mo layers between the first electrode 115 and the piezoelectric layer 120, and between the piezoelectric layer 120 and the second electrode 125 may redistribute part of the energy from the outer W layers to the inner Mo layers, while still keeping the same amount of acoustic energy (and therefore $kt_2$, for instance) confined in piezoelectric layer 120. Thus Mo layer would form acoustic redistribution layer for the original stack of acoustic resonator 100 comprising pure W electrodes. In practical situations, ALR layer may replace part of the original metal layer comprising the first and second electrodes 115 and 125, respectively, and the piezoelectric layer 120 thickness may need to be adjusted in order to match the original series and parallel resonance frequencies Fs and Fp, respectively. An example of acoustic impedance distribution in acoustic stack with Mo ARL is shown schematically in FIG. 1C as layers 115t and 125b, while the remaining portions of original W electrodes are shown as lavers 115b and 125t.

Figure 2:
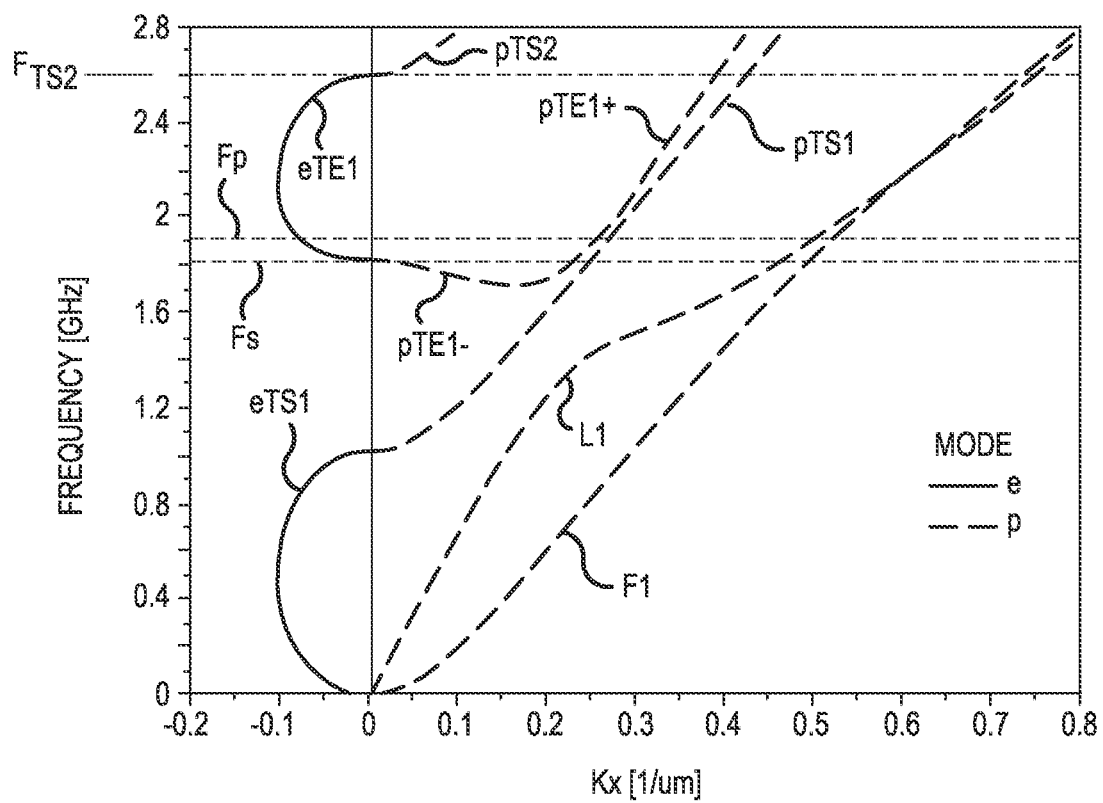
FIG. 2 is an acoustic dispersion diagram illustrating simulated vibrational modes of an acoustic resonator at different frequencies.

FIG. 2 is an acoustic dispersion diagram illustrating simulated vibrational modes of an acoustic resonator at different frequencies. This diagram was generated with respect to a variation of acoustic resonator 100 in which first and second electrodes 115 and 125 are each formed entirely of Mo. In other words, the curves in FIG. 2 represent the performance of acoustic resonator 100 in the absence of acoustic redistribution layers. In the simulated device, first and second electrodes 115 and 125 each have a thickness of approximately 4200 Å, and piezoelectric layer 120 comprises AlN with a thickness of approximately 10000 Å. In this configuration approximately 80% of the acoustic energy is confined in piezoelectric layer 120 during operation of acoustic resonator 100.

In FIG. 2, the horizontal axis corresponds to the lateral wave-number Kx, with positive numbers indicating real Kx values and negative numbers indicating imaginary Kx values. Each point in FIG. 2 corresponds to an eigen-mode of specific acoustic polarization and direction of propagation supported by the acoustic stack. Real Kx values (illustrated by solid curves) indicate that a given mode is a propagating one (e.g., it may propagate in a periodic fashion from a point of excitation) while imaginary Kx values (illustrated by dashed curves) indicate that a given mode is an evanescent one (e.g., it may decay exponentially from a point of excitation).

The modes illustrated in FIG. 2 include the following: dilatational (L1), flexural (F1), evanescent thickness shear (eTS1), propagating thickness shear (pTS1), propagating thickness extensional with negative group velocity dispersion (pTE1−), propagating thickness extensional with positive group velocity dispersion (pTE1+), evanescent thickness extensional (eTE1), and propagating thickness shear of second order (pTS2). Note that the notation used here does not follow the standard separation of modes into symmetric and anti-symmetric classes because the acoustic stacks comprising acoustic resonator 100 may be significantly more complicated than single layers for which such classification is valid. So called complex evanescent modes are not shown in FIG. 2 for simplicity of a presentation. Complex evanescent modes propagate in a periodic fashion from a point of excitation, but their amplitude of the oscillations decays exponentially. Generally, these modes are very short range, meaning that they decay within 1-2 um from the excitation point and usually do not contribute to radiative energy loss.

Series (Fs), parallel (Fp) and second-order shear ($F_{TS2}$) resonance frequencies are shown as dashed horizontal lines. Fractional Frequency Separation can be expressed mathematically by the following equation (1).

$$FFS=100*(F_{TS2}-Fs)/Fs \; [\%] \quad (1)$$

The significance of FFS in minimization of radiative losses at parallel resonance frequency Fp and maximization of Rp will be discussed in detail in relation to FIG. 3, and it reties on an overlap (or degree of similarity) between Mason pseudo-mode and eTE eigen-mode throughout the acoustic stack. The Mason pseudo-mode is a specific distribution of longitudinal Uz displacement throughout the acoustic stack of acoustic resonator 100 produced by vertical voltage applied between first and second electrodes 115 and 125, respectively. On the dispersion diagram shown in FIG. 2 the Mason pseudo-mode may be represented as a vertical line at Kx=0, which corresponds to spatially uniform distribution of Uz in a lateral direction of acoustic resonator 100—for that reason the Mason pseudo-mode may be also referred to as a piston mode. Note that Mason pseudo-mode does not have any shear displacement component at any frequency of operation, and is $1^{st}$ order thickness extensional mode around Fs meaning that longitudinal Uz displacement has one null close to the center of the stack while the bottom and top of the stack are displaced in the opposite direction with respect to their initial (that is without applied voltage) position. On the other hand, pTE1−, eTE1 and pTS2 modes belong to a family of $1^{st}$ order thickness extensional and $2^{nd}$ order thickness shear mode, meaning that longitudinal Uz displacement has one null close to the center of the stack (similarly to the Mason pseudo-mode) and shear Ux displacement has two nulls inside the stack. As frequency changes from below Fs to above $F_{TS2}$ in FIG. 2 the dominant polarization of the mode represented by pTE1−, eTE1 and pTS2 branches changes from predominantly longitudinal around Fs frequency to predominantly shear around $F_{TS2}$ frequency, and at the same time the mode order changes from predominantly $1^{st}$ order around Fs frequency to predominantly $2^{nd}$ order around $F_{TS2}$ frequency. In particular, at Fp the eTE1 eigen-mode is a mixed longitudinal/shear and $1^{st}/2^{nd}$ order mode, with the specific partitioning of energy between Uz and Ux components depending on frequency separation between $F_{TS2}$ and Fs, and between Fp and Fs. Since for most of the acoustic stacks Fp is relatively close to Fs as compared to $F_{TS2}$, FFS can be used as a simple measure of modal similarity between eTE1 eigen-mode and Mason pseudo-mode. Note that for frequency F in a very close proximity to Fs (F−Fs<<Fp−Fs) the Mason pseudo-mode and eTE1 eigen-mode are practically identical.

Figure 3A:
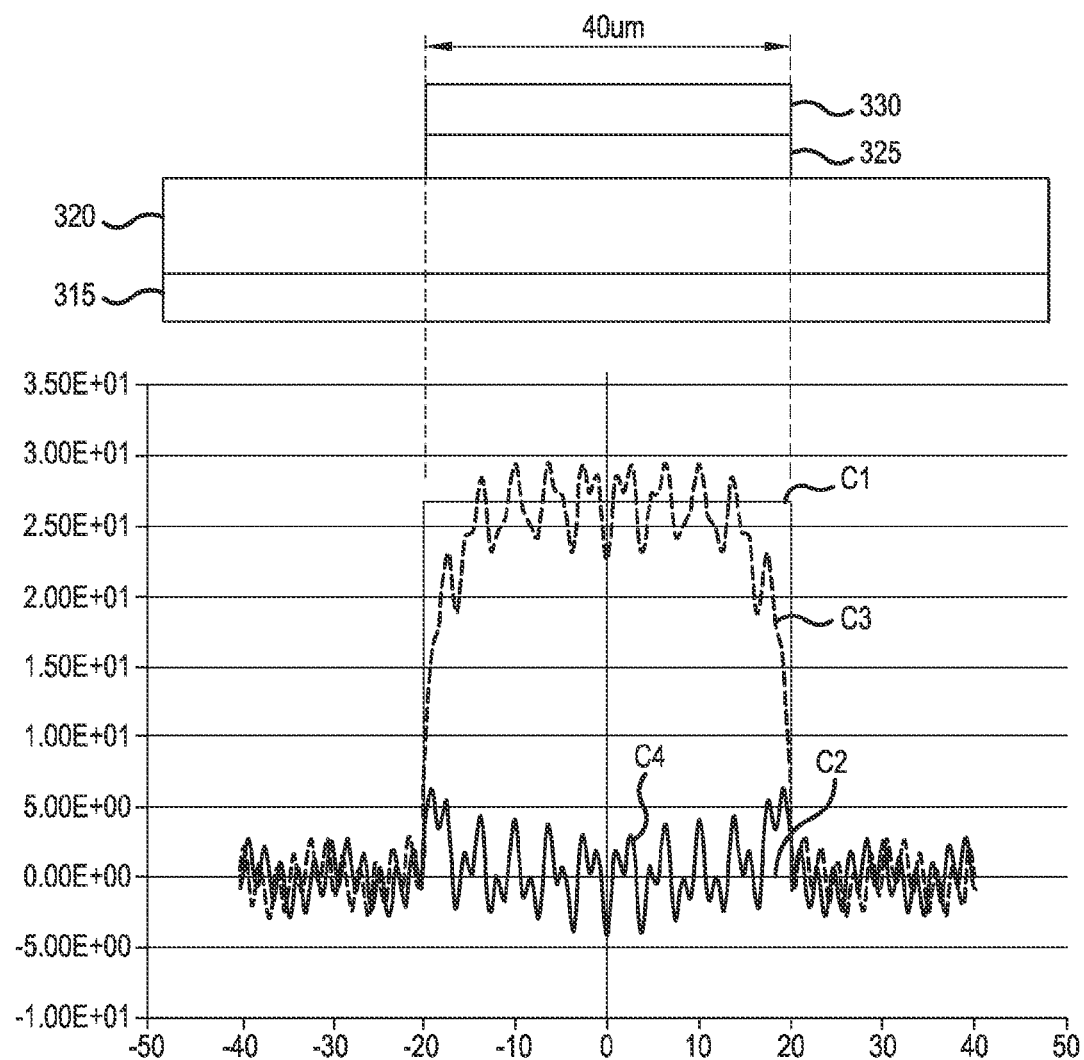
FIG. 3A is a graph illustrating longitudinal (Uz) displacements of an acoustic resonator operating at parallel resonance frequency Fp.
Figure 3B:
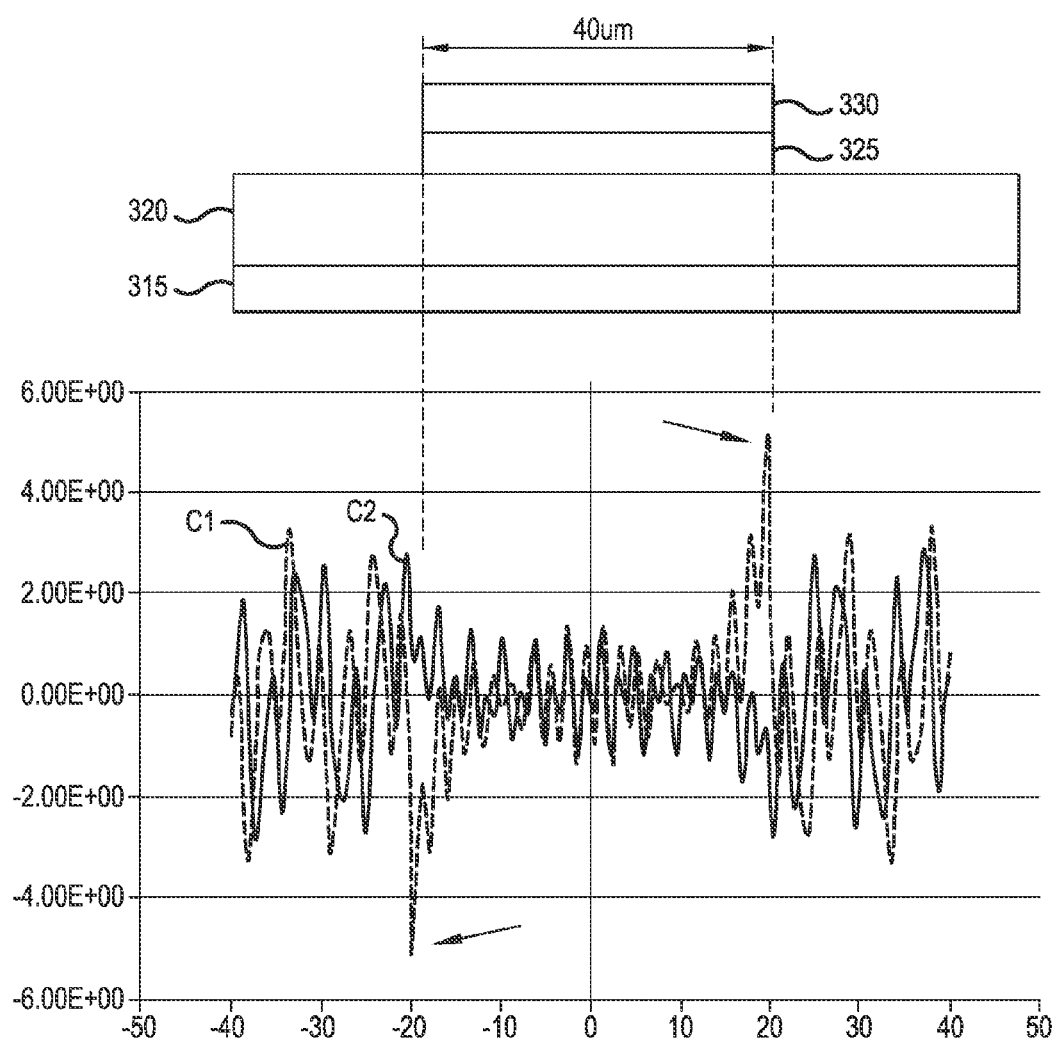
FIG. 3B is a graph illustrating shear (Ux) displacements of an acoustic resonator operating at parallel resonance frequency Fp.

FIGS. 3A and 3B are graphs illustrating longitudinal (Uz) and shear (Ux) displacements, respectively, of an acoustic resonator operating at parallel resonance frequency Fp. The horizontal axis corresponds to lateral location inside the resonator and is shown in micrometers (um). The longitudinal Uz and shear Ux displacements were simulated using the mode-matching method with respect to a 40 um wide FBAR as shown in the drawings. The simulated stack has the first electrode 315 formed of Mo with approximate thickness of 3800 A, the piezoelectric layer 320 formed of AlN with approximate thickness of 9300 A, the second electrode 325 formed of Mo with approximate thickness of 3250 A and the passivation layer 330 formed of AlN with approximate thickness of 2000 A. The illustrated displacements have been computed at approximately 1200 A above the interface between the first electrode 315 and the piezoelectric layer 320. The illustrated FBAR has a computed Rp of ~1.5 k. Its active region (inside the dotted lines) has Fs of ~2.03 GHz, kt$^2$ of ~5.8%, and FFS ~42%. Its field region (outside the dotted lines) has Fs of ~3.38 GHz, Kt2 of ~4.6%, and FFS of ~20%. The applied voltage was 1V, and the Uz and Ux displacements are shown in picometers (pm).

FIG. 3A shows real (curve C1) and imaginary (curve C2) parts of Mason pseudo-mode displacements, and real (curve C3) and imaginary (curve C4) parts of total displacements. FIG. 3B shows only the real (curve C1) and imaginary (curve C2) parts of total displacements because the Mason pseudo-mode does not support any non-zero shear displacement component.

For the illustrated FBAR at simulated at parallel resonance frequency Fp, the Uz displacement for Mason pseudo-mode (curve C1 in FIG. 3A) is flat across the electrode and is terminated abruptly at the edges of the top electrode indicated by vertical dashed lines. As mentioned above, the cutoff frequency for the thickness extensional TE1 resonance in the field region is approximately 1.3 GHz higher than in the active region (where Fs is approximately 2.03

GHz), which essentially clamps the total displacement outside of the active region. That clamping requirement enforces (through appropriate stress and particle velocity continuity conditions) suppression of total motion at the edge of the top electrode, which may be accomplished primary by mechanical excitation of eTE1 mode in the opposite phase to the Mason pseudo-mode (driven by electric field). As a result, total Uz displacement exhibits evanescent decay towards the electrode edges (at +/−20 um), as illustrated in FIG. 3A. However, eTE1 mode may not completely suppress total Uz displacement (curves C3 and C4 in FIG. 3A) at the edges of the top electrode because it also contains a non-zero shear Ux displacement. Since Mason pseudo-mode is purely longitudinal, the total shear component of total displacement at the edge of the top electrode is predominantly equal to shear Ux component of eTE1 mode at the top electrode edges may occur, as illustrated with curves C1 and C2 in FIG. 3B. The arrows in FIG. 3B point to the top electrode edges where total Ux displacement reaches maximum values. Therefore, incomplete suppression of Mason's pseudo-mode longitudinal Uz displacement component and enhanced excitation of eTE1 eigen-mode's shear Ux displacement component at the top electrode edges require excitation of other propagating and complex eigen-modes to facilitate the necessary stress and particle velocity continuity conditions at the top electrode edge. These propagating modes in the active region (pTE1, pTS1, L1 and F1) are evidenced by additional higher spatial frequency displacements superimposed on evanescent and flat portions of total longitudinal Uz and shear Ux displacements illustrated in FIGS. 3A and 3B, respectively. The propagating modes in the field region (pTS1, L1 and F1) are evidenced by periodic total longitudinal Uz and shear Ux displacements illustrated in FIGS. 3A and 3B, respectively. Propagating, evanescent and complex modes excited in the main active region lead to enhanced localized viscous loss and to the ohmic loss due to Joule heating provided a given mode contains thickness extensional component. Propagating modes in the field region lead to acoustic radiation of energy to surrounding areas. All three loss mechanisms (radiative, viscous and ohmic) degrade resonator performance, and in particular lower resonator's parallel resistance Rp and quality factor Q.

As noted above, a predominant reason for enhanced acoustic loss at parallel resonance frequency Fp is inability to completely suppress electrically excited longitudinal displacements of the Mason pseudo-mode with evanescent eTE1 eigen-mode due to the presence of non-zero shear component of the eTE1 eigen-mode. However, as noted in relation to FIG. 2, the amount of shear component in eTE1 eigen-mode is predominantly determined by FFS, that is by the separation of $2^{nd}$ order shear cut-off frequency $F_{TS2}$ from the series resonance frequency Fs. Thus, by redesigning the acoustic stack to increase FFS one may reduce the shear component in eTE1 eigen-mode, facilitate more efficient suppression of total motion at the edge of the top electrode, and therefore increase Rp and Q-factor. As will be shown in relation to FIG. 4, for metal-heavy stacks such stack redesign is possible with Acoustic Redistribution Layers.

Figure 4:
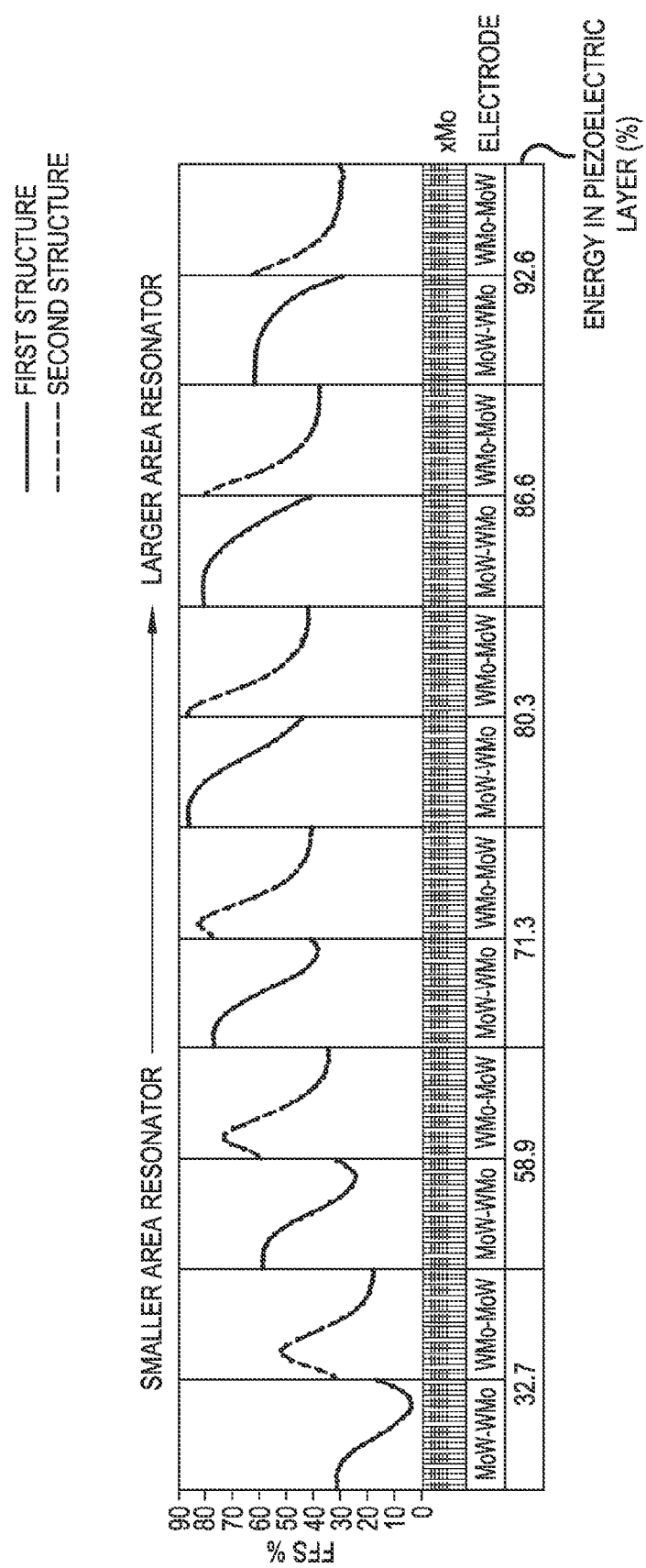
FIG. 4 is a graph illustrating fractional frequency separation (FFS) as a function of stack design, according to various representative embodiments.

FIG. 4 is a graph illustrating FFS as a function of stack design, according to various representative embodiments. In sub-graphs shown in FIG. 4, solid curves represent FFS of acoustic resonators having a first structure, and dashed curves represent the FFS of acoustic resonators having a second structure. The first structure corresponds to a variation of acoustic resonator 100 in which piezoelectric layer 120 is formed of ASN, and each of first and second electrodes 115 and 125 is formed of a layer of W adjacent to piezoelectric layer 120 and a layer of Mo adjacent to the layer of W (labeled "MoW—WMo"). The second structure is the same as the first structure, except that the locations of the layers of Mo and W are switched in each of the first and second electrodes 115 and 125 (labeled "WMo—MoW"). Each resonator shown if FIG. 4 has the same series resonance frequency Fs. However, each sub-graph corresponds to resonators having different fraction of total acoustic energy confined in the piezoelectric layer as indicated by the most outer horizontal axis. Stated differently, each sub-graph corresponds to resonators having different $kt^2$, where small fraction of acoustic energy confined in the piezoelectric layer corresponds to low $kt^2$, and large fraction of acoustic energy confined in the piezoelectric layer corresponds to high $kt^2$.

The graph was generated for simulated acoustic resonators having different cross-sectional areas (e.g., an area as shown in FIG. 1B) and different fractions of Mo total electrode thickness. The acoustic resonators cross-sectional areas vary from small to large as viewed in FIG. 4. The different fractions of Mo are indicated by the label "xMo", which is defined by the following equation (2).

$$x\text{Mo} = t\text{Mo}/(t\text{Mo} + t\text{W}) \quad (2)$$

In equation (2), tMo corresponds to the thickness of each layer of Mo, and tW represents the thickness of each layer of W. Thus, xMo corresponds to a thickness of Mo layer normalized by the total electrode thickness. In each sub-graph, xMo ranges from 0 (on the left side) to 1 (on the right side) in steps of 0.05. Moreover, perfectly symmetric stacks were assumed, meaning that fraction and location of Mo with respect to piezoelectric layer in bottom and top electrode is identical. For example, xMo=0.1 for "WMo—MoW" design indicates that Mo layer comprises 10% of the total electrode thickness-wise for each of bottom and top electrodes, and Mo layers are located next to the piezoelectric layer. For another example, xMo=0.1 for "MoW—WMo" design indicates that Mo layer comprises 10% of the total electrode thickness-wise for each of bottom and top electrodes, and W layers are located next to the piezoelectric layer.

As illustrated in FIG. 4, the maximum FFS is the largest for stacks having approximately 80% of energy confined in the piezoelectric layer. For those stacks, FFS is approximately 50% for pure-Mo electrodes and approximately 90% for pure-W electrodes. Thus, for designs where approximately 80% of energy is confined in piezoelectric layer it may be beneficial to use high acoustic impedance electrodes (like W or Ir as opposed to Mo or Nb, for instance) to increase FFS and therefore Rp and Q of the resonator. Generally, $2^{nd}$ order shear resonance $F_{TS2}$ (and therefore FFS, for fixed Fs) is determined by specific distribution of energy at TS2 resonance throughout the stack. Numerical simulations indicate that for resonators with single metal electrodes (e.g., only W or only Mo) maximum FFS design correspond to a stack for which fraction of eigen-modal energy at TS2 resonance is approximately equally distributed between piezoelectric and metal layers. Thus, for either pure Mo (xMo=1) or pure W (xMo=0) designs shown in FIG. 4 the maximum FFS point (approximately 80% of Mason's pseudo-mode acoustic energy confined in piezoelectric layer at Fp) corresponds to a design for which TS2 eigen-mode energy peaks at $F_{TS2}$ are located approximately at the interface between piezoelectric and metal layers. For metal-heavy designs (that is less than approximately 80% of Mason's pseudo-mode acoustic energy is confined in piezoelectric layer at Fp) the TS2 eigen-mode energy peaks at $F_{TS2}$ are located inside the metal layers, and for metal-light designs (that is more than approximately 80% of Mason's pseudo-mode acoustic energy is confined in piezoelectric layer at Fp) the TS2 eigen-mode energy peaks at $F_{TS2}$ are located inside the piezoelectric layer. However, the Poisson ratios of piezoelectric and metal layers also play a significant role in determining pseudo-mode energy distributions at $F_{TS2}$, and therefore FFS for any specific stack.

In general, the fraction of energy in the piezoelectric layer determines the $kt^2$ of the acoustic resonator. Acoustic resonators with large $kt^2$ typically have thick piezoelectric layer, thin electrode layers, and large fraction of energy confined in the piezoelectric layer (e.g. over 90%). However, with a thick piezoelectric layer, a relatively large cross-sectional area is needed to match the required resonators impedance, e.g., to Zo=50 ohms yielding unfavorable increase of the device cost.

The cost of an acoustic resonator is generally proportional to its cross-sectional area, so other things being equal, it is usually desirable to minimize the cross-sectional area. To minimize the cross-sectional area, the piezoelectric layer may be formed of a material having intrinsically high $kt^2$ (e.g., ASN with 9% scandium), allowing the piezoelectric layer to be relatively thin while maintaining adequate $kt^2$. In such an acoustic resonator, a relatively high amount of energy may be confined in electrode layers, e.g. 70% in the electrode layers and 30% in the piezoelectric layer, as illustrated by a sub-graph at the far left of FIG. 4. This unfortunately leads to severe degradation of FFS, e.g., to approximately 20% for Mo (xMo=1) and to approximately 30% for pure W (xMo=0). However, the use of acoustic redistribution layers ("WMo—MoW" electrodes, with Mo layer redistributing acoustic energy from W layer) can increase FFS to approximately 50% for small resonators by using WMo—MoW electrodes, as illustrated by a sub-graph second from left in FIG. 4. Numerical simulations indicate that the maximum FFS design in the presence of acoustic redistribution layer formed of Mo corresponds to the peak of TS2 eigen-mode at $F_{TS2}$ resonance being located approximately at the interface between Mo and W layers. Thus, specific design of optimal ARL may depend on acoustic impedance and Poisson ratios of materials used in a specific stack. As indicated above and demonstrated below in relation to FIG. 5, beneficial increase in FFS corresponds to an increase in Rp, and therefore the increase in FFS corresponds to improved acoustic resonator performance.

Figure 5:
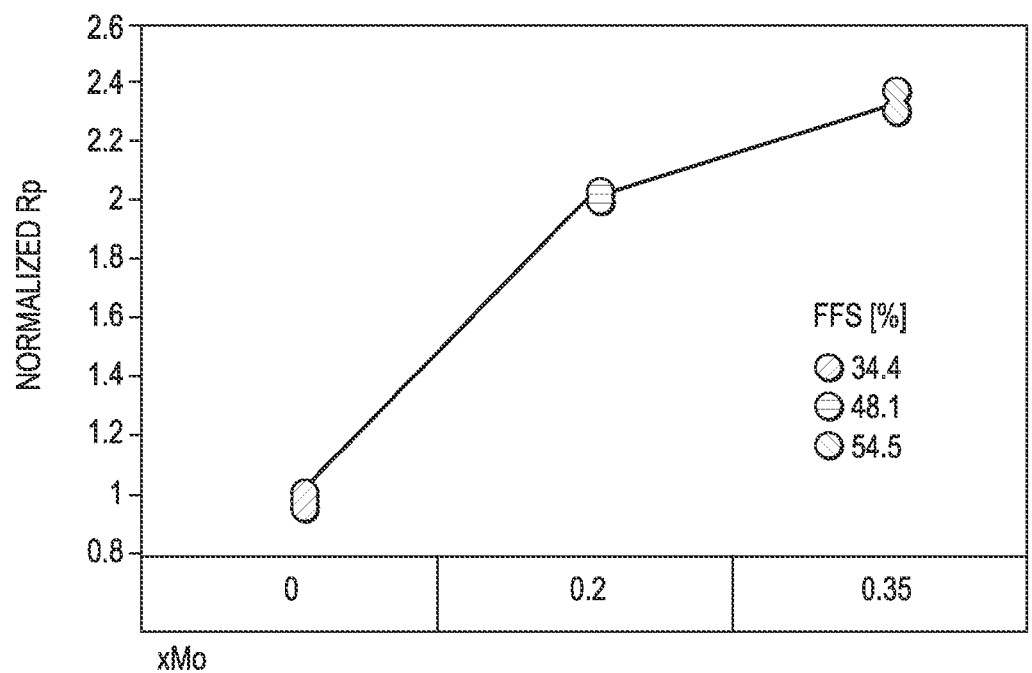
FIG. 5 is a graph illustrating the normalized Rp of the acoustic resonator shown in FIG. 1B as a function of the normalized thickness of a layer of molybdenum.

FIG. 5 is a graph illustrating the normalized Rp of acoustic resonator 100 shown in FIG. 1B as a function of xMo. In FIG. 5, normalized Rp is plotted for xMo=0, which corresponds to acoustic resonator 100 with tungsten-only electrodes, and for xMo=0.2 and xMo=0.35 corresponding to acoustic resonator 100 with approximately 20% and 35% of W being replaced with Mo. The normalized Rp has been obtained by diving the best achievable Rp for each of the stacks by the best achievable Rp for pure-W stack (that is a stack with xMo=0). For all measured stack the piezoelectric layer 120 is formed of ASN having a scandium concentration of 9%.

The use of ASN, which has relatively high intrinsic $kt^2$, allows the acoustic resonators to be formed with a relatively thin piezoelectric layer (i.e., small cross-sectional area) while maintaining adequate $kt^2$ for certain applications, such as RF filters for low-bands (e.g. Band 13, 17,20, etc). However, it also requires these resonators to use metal-heavy stacks in which less than 80% of energy is confined in the piezoelectric layer. As a result, FFS tends to decrease, as shown in FIG. 4, and the stacks may yield poor Rp.

As illustrated in FIG. 5, the use of acoustic redistribution layers (replacing some of W next to 9%-ASN with Mo, as indicated by xMo) increases FFS from approximately 35% for the design with xMo=0 to approximately 55% with xMo=0.35, and it increases Rp by approximately 2 times for xMo=0.2 design and by approximately 2.4 times for xMo=0.35. As a result, significant area and cost savings are possible with Acoustic Redistribution Layers without a penalty to device performance.

FIGS. 6 through 11 illustrate several alternative configurations for acoustic stack 110 in acoustic resonator 100, according to representative embodiments. FIGS. 6 through 11 also illustrate acoustic impedance profiles for each of those different alternative configurations. The material selection in FIGS. 6 through 11 is provided for illustrative purposes only and various other combinations are possible in alternative embodiments.

Figure 6A:
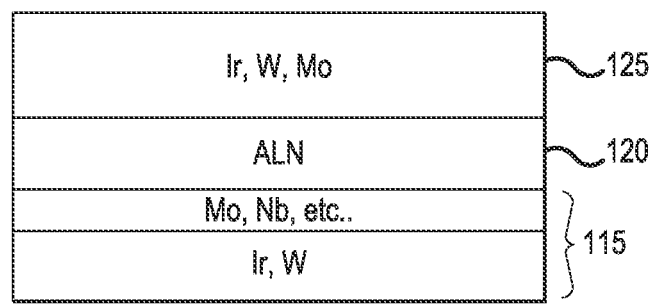
FIG. 6A is a cross-sectional view of an acoustic stack variation for the acoustic resonator of FIG. 1B, according to a representative embodiment.
Figure 6B:
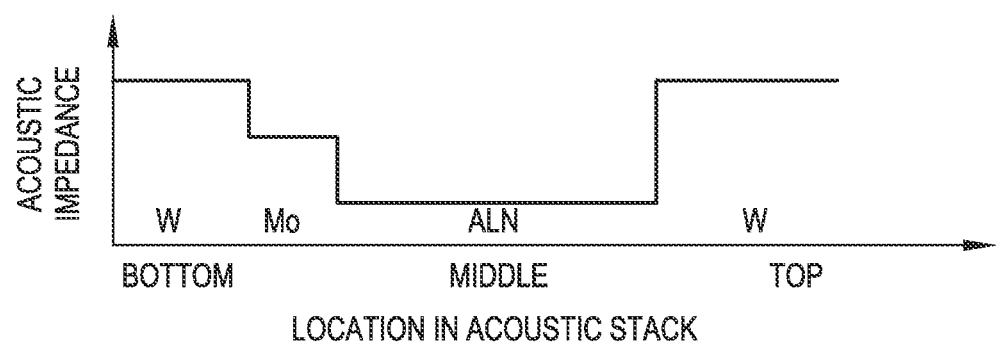
FIG. 6B is a graph illustrating an acoustic impedance profile the acoustic stack illustrated in FIG. 6A.
Figure 7A:
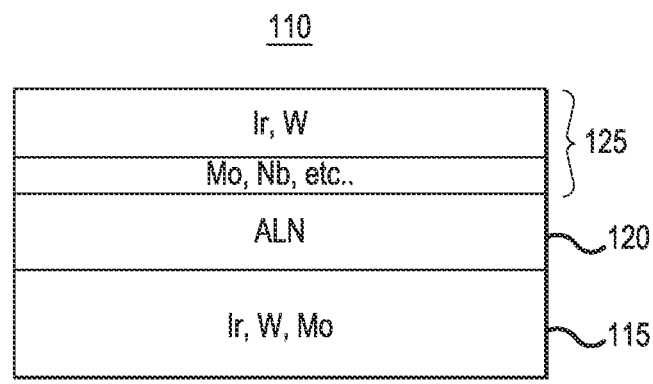
FIG. 7A is a cross-sectional view of an acoustic stack variation for the acoustic resonator of FIG. 1B, according to a representative embodiment.
Figure 7B:
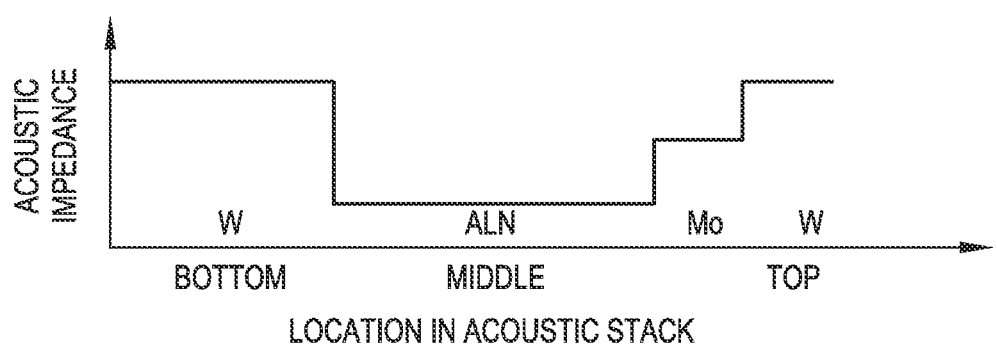
FIG. 7B is a graph illustrating an acoustic impedance profile the acoustic stack illustrated in FIG. 7A.
Figure 8A:
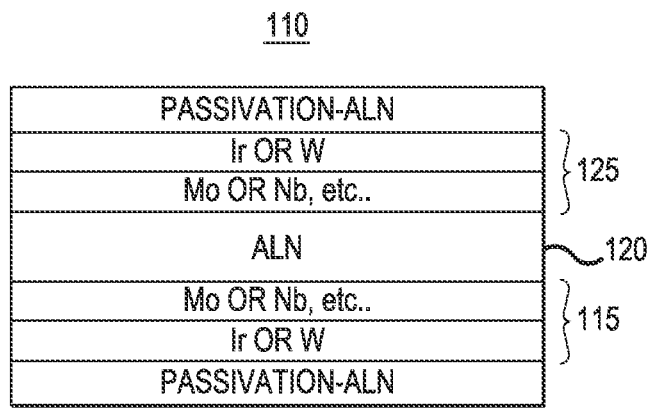
FIG. 8A is a cross-sectional view of an acoustic stack variation for the acoustic resonator of FIG. 1B, according to a representative embodiment.
Figure 8B:
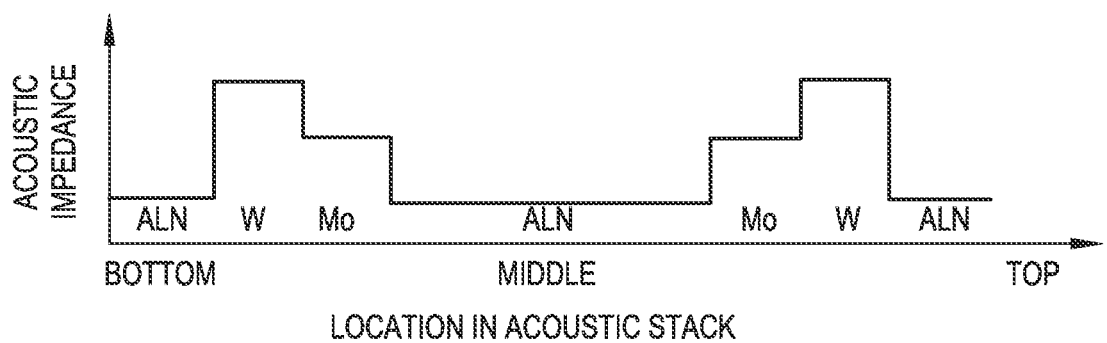
FIG. 8B is a graph illustrating an acoustic impedance profile the acoustic stack illustrated in FIG. 8A.
Figure 9A:
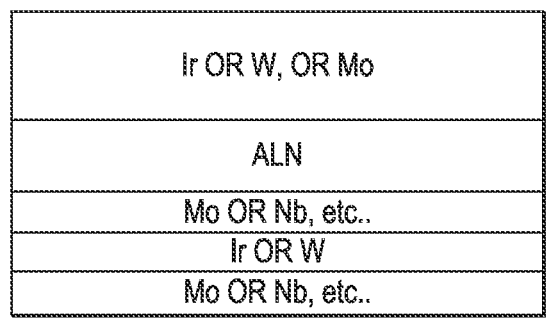
FIG. 9A is a cross-sectional view of an acoustic stack variation for the acoustic resonator of FIG. 1B, according to a representative embodiment.
Figure 9B:
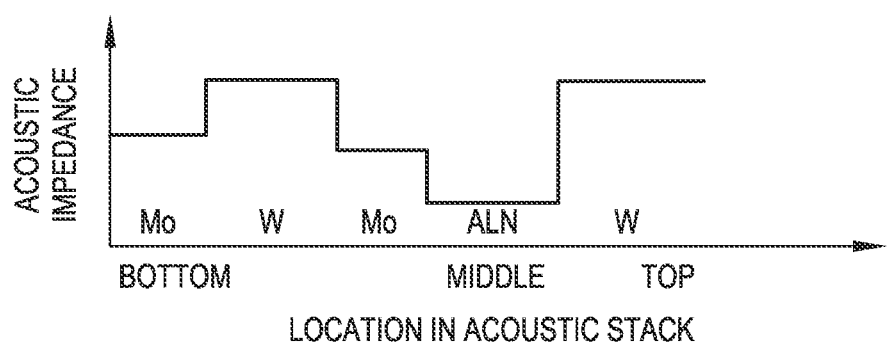
FIG. 9B is a graph illustrating an acoustic impedance profile the acoustic stack illustrated in FIG. 9A.
Figures 10A, 10B:
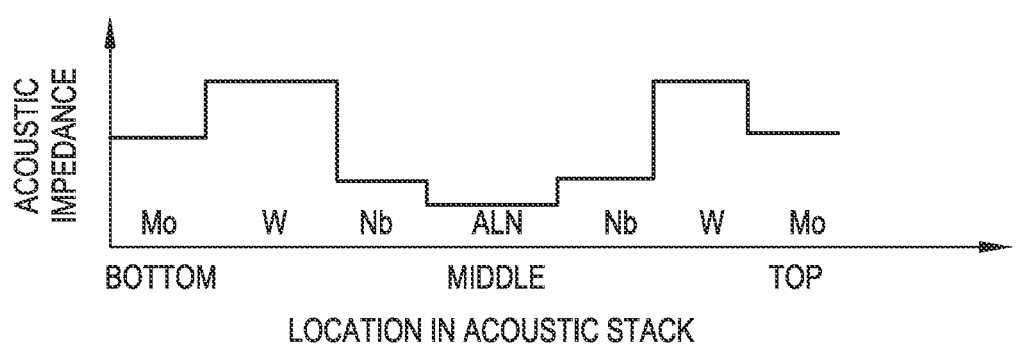
FIG. 10A is a cross-sectional view of an acoustic stack variation for the acoustic resonator of FIG. 1B, according to a representative embodiment.
FIG. 10B is a graph illustrating an acoustic impedance profile the acoustic stack illustrated in FIG. 10A.
Figure 11A:
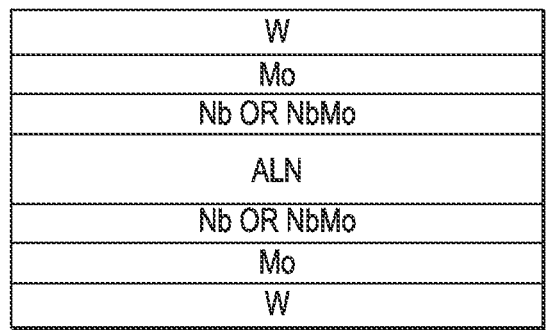
FIG. 11A is a cross-sectional view of an acoustic stack variation for he acoustic resonator of FIG. 1B, according to a representative embodiment.
Figure 11B:
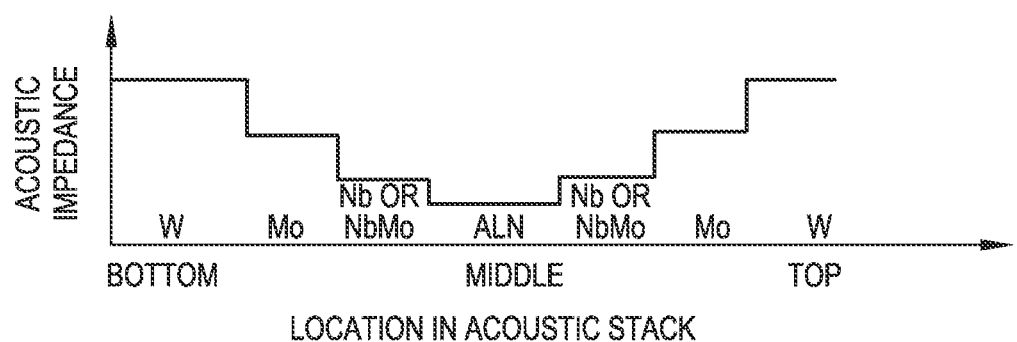
FIG. 11B is a graph illustrating an acoustic impedance profile the acoustic stack illustrated in FIG. 11A.

Referring to FIGS. 6A and 6B, in one embodiment acoustic stack 110 comprises first electrode 115 with two metal layers of different acoustic impedances, and second electrode 125 with a single metal layer. The acoustic impedances of the two metal layers of first electrode 115 increase with distance from piezoelectric layer 120. The layers in FIG. 6A are labeled with various alternative materials, and the graph of FIG. 6B shows a selected example of material for each layer. In each of FIGS. 6 through 11, piezoelectric layer 120 is shown as a layer of AlN, but it could alternatively comprise a different material, such as ASN or ZnO, for example. FIGS. 7 through 11 are similar to FIG. 6, except that the layers of first and second electrodes 115 and 125 are rearranged and/or constituted as shown in the diagrams and graphs. Potential benefits of these alternative configurations will be apparent from the above description of FIGS. 1 through 5.

While example embodiments are disclosed herein, one of ordinary skill in the art appreciates that many variations that are in accordance with the present teachings are possible and remain within the scope of the appended claims. For example, different set of metals may be used in top and bottom electrodes. In another example, replacement fraction of one metal with another metal may be different in top electrode from replacement fraction in the bottom electrode. The embodiments therefore are not to he restricted except within the scope of the appended claims.

The invention claimed is:
1. An acoustic resonator structure, comprising:
a piezoelectric layer having a first surface and a second surface;
a first electrode disposed adjacent to the first surface, the first electrode comprising: a first conductive layer disposed adjacent to the piezoelectric layer and having a first acoustic impedance, and a second conductive layer disposed on a side of the first conductive layer opposite the piezoelectric layer and having a second acoustic impedance greater than the first acoustic impedance; and
a second electrode disposed adjacent to the second surface, the second electrode comprising: a third conductive layer disposed adjacent to the piezoelectric layer and having a third acoustic impedance, and a fourth conductive layer disposed on a side of the third conductive layer opposite the piezoelectric layer and having a fourth acoustic impedance greater than the third acoustic impedance;

wherein the first and third conductive layers are formed of a first material, and the second and fourth conductive layers are formed of a second material.

2. The acoustic resonator structure of claim 1, further comprising a substrate, wherein the first electrode is disposed between the substrate and the piezoelectric layer.

3. The acoustic resonator structure of claim 1, further comprising a substrate, wherein the second electrode is disposed between the substrate and the piezoelectric layer.

4. The acoustic resonator structure of claim 1, wherein the first electrode, the piezoelectric layer, and the second electrode form an acoustic stack of a film bulk acoustic resonator (FBAR).

5. The acoustic resonator structure of claim 1, wherein the first material is molybdenum and the second material is tungsten.

6. The acoustic resonator structure of claim 1, wherein the first conductive layer is formed of molybdenum and the second conductive layer is formed of tungsten.

7. The acoustic resonator structure of claim 1, wherein the first conductive layer is formed of niobium, molybdenum, or an alloy of niobium and molybdenum, and the second conductive layer is formed of tungsten or iridium.

8. The acoustic resonator structure of claim 7, wherein the second electrode is formed of tungsten, iridium, or molybdenum.

9. The acoustic resonator structure of claim 8, further comprising a substrate, wherein the first electrode is disposed between the substrate and the piezoelectric layer.

10. The acoustic resonator structure of claim 1, wherein the piezoelectric layer comprises aluminum scandium nitride having a scandium concentration of about 1-10%.

11. The acoustic resonator structure of claim 1, further comprising a passivation layer disposed on a side of one of the first and second electrodes opposite the piezoelectric layer, and a seed layer disposed on a side of the other of the first and second electrodes opposite the piezoelectric layer.

12. The acoustic resonator structure of claim 1, wherein the first electrode further comprises a third conductive layer disposed on a side of the second conductive layer opposite the first conductive layer.

13. The acoustic resonator structure of claim 12, wherein the third conductive layer has a third acoustic impedance greater than the second acoustic impedance.

14. The acoustic resonator structure of claim 12, wherein the first conductive layer comprises niobium or an alloy of niobium and molybdenum, the second conductive layer comprises molybdenum, and the third conductive layer comprises tungsten.

15. The acoustic resonator structure of claim 12, wherein the third conductive layer has a third acoustic impedance lower than the second acoustic impedance.

16. The acoustic resonator structure of claim 12, wherein the first conductive layer comprises niobium or an alloy of niobium and molybdenum, the second conductive layer comprises tungsten, and the third conductive layer comprises molybdenum.

17. The acoustic resonator structure as claimed in claim 1, wherein the piezoelectric layer comprises $Al_{i-x}Sc_xN$.

18. The acoustic resonator structure of claim 11, wherein the passivation layer and the seed layer each comprise one of aluminum nitride, silicon carbide, silicon nitride, aluminum oxide and boron-doped silicon oxide.

19. An acoustic resonator structure, comprising:
a piezoelectric layer having a first surface and a second surface;
a first electrode disposed adjacent to the first surface;
a second electrode disposed adjacent to the second surface;
a passivation layer disposed on a side of one of the first and second electrodes opposite the piezoelectric layer; and
a seed layer disposed on a side of the other of the first and second electrodes opposite the piezoelectric layer, wherein the first electrode comprises a first conductive layer disposed adjacent to the piezoelectric layer and having a first acoustic impedance, and a second conductive layer disposed on a side of the first conductive layer opposite the piezoelectric layer and having a second acoustic impedance greater than the first acoustic impedance.

20. The acoustic resonator structure of claim 19, wherein the passivation layer and the seed layer each comprise one of aluminum nitride, silicon carbide, silicon nitride, aluminum oxide and boron-doped silicon oxide.

21. The acoustic resonator structure of claim 19, further comprising a substrate, wherein the first electrode is disposed between the substrate and the piezoelectric layer.

22. The acoustic resonator structure of claim 19, further comprising a substrate, wherein the second electrode is disposed between the substrate and the piezoelectric layer.

23. The acoustic resonator structure of claim 19, wherein the first electrode, the piezoelectric layer, and the second electrode form an acoustic stack of a film bulk acoustic resonator (FBAR).

24. The acoustic resonator structure of claim 19, wherein the first conductive layer is formed of molybdenum and the second conductive layer is formed of tungsten.

25. The acoustic resonator structure of claim 19, wherein the first conductive layer is formed of niobium, molybdenum, or an alloy of niobium and molybdenum, and the second conductive layer is formed of tungsten or iridium.

26. The acoustic resonator structure of claim 25, wherein second electrode comprises a third conductive layer disposed adjacent to the piezoelectric layer and having a third acoustic impedance, and a fourth conductive layer disposed on a side of the third conductive layer opposite the piezoelectric layer and having a fourth acoustic impedance greater than the third acoustic impedance.

27. The acoustic resonator structure of claim 25, wherein the second electrode is formed of tungsten, iridium, or molybdenum.

28. The acoustic resonator structure of claim 27, further comprising a substrate, wherein the first electrode is disposed between the substrate and the piezoelectric layer.

29. The acoustic resonator structure of claim 19, wherein the piezoelectric layer comprises aluminum scandium nitride having a scandium concentration of about 1-10%.

30. The acoustic resonator structure of claim 19, wherein the first electrode further comprises a third conductive layer disposed on a side of the second conductive layer opposite the first conductive layer.

31. The acoustic resonator structure of claim 30, wherein the third conductive layer has a third acoustic impedance greater than the second acoustic impedance.

32. The acoustic resonator structure of claim 30, wherein the first conductive layer comprises niobium or an alloy of niobium and molybdenum, the second conductive layer comprises molybdenum, and the third conductive layer comprises tungsten.

33. The acoustic resonator structure of claim 30, wherein the third conductive layer has a third acoustic impedance lower than the second acoustic impedance.

34. The acoustic resonator structure of claim 30, wherein the first conductive layer comprises niobium or an alloy of niobium and molybdenum, the second conductive layer comprises tungsten, and the third conductive layer comprises molybdenum.

35. The acoustic resonator structure as claimed in claim 19, wherein the piezoelectric layer comprises $Al_{1-x}Sc_xN$.

* * * * *